United States Patent
Youn et al.

(10) Patent No.: US 7,795,110 B2
(45) Date of Patent: Sep. 14, 2010

(54) TRENCH ISOLATION TYPE SEMICONDUCTOR DEVICE WHICH PREVENTS A RECESS FROM BEING FORMED IN A FIELD REGION AND METHOD OF FABRICATING THE SAME

(75) Inventors: Ki-seog Youn, Suwon-si (KR);
Jong-hyon Ahn, Suwon-si (KR);
Deok-hyung Lee, Seoul (KR);
Sung-gun Kang, Suwon-si (KR);
Kong-soo Cheong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 186 days.

(21) Appl. No.: 12/070,808

(22) Filed: Feb. 21, 2008

(65) Prior Publication Data
US 2008/0188057 A1 Aug. 7, 2008

Related U.S. Application Data

(62) Division of application No. 11/301,510, filed on Dec. 13, 2005, now Pat. No. 7,358,588.

(30) Foreign Application Priority Data
Dec. 14, 2004 (KR) ...................... 10-2004-0105646

(51) Int. Cl.
*H01L 21/76* (2006.01)
(52) U.S. Cl. ................ 438/437; 257/E21.546
(58) Field of Classification Search ............ 438/437
See application file for complete search history.

(56) References Cited

U.S. PATENT DOCUMENTS

| 6,225,225 | B1 * | 5/2001 | Goh et al. ............ 438/692 |
| 6,255,194 | B1 * | 7/2001 | Hong ................ 438/435 |
| 6,297,126 | B1 | 10/2001 | Lim et al. |
| 6,939,780 | B2 | 9/2005 | Yun et al. |
| 7,033,909 | B2 * | 4/2006 | Kim et al. ............ 438/435 |
| 2001/0015046 | A1 | 8/2001 | Hong |
| 2004/0072408 | A1 | 4/2004 | Yun et al. |
| 2004/0198019 | A1 * | 10/2004 | Yasui et al. .......... 438/435 |
| 2005/0196928 | A1 * | 9/2005 | Bonser et al. ......... 438/296 |

FOREIGN PATENT DOCUMENTS

| KR | 10-0353832 | 9/2002 |
| KR | 10-2004-0004990 | 1/2004 |
| KR | 10-2004-0032531 | 4/2004 |

* cited by examiner

*Primary Examiner*—Chandra Chaudhari
(74) *Attorney, Agent, or Firm*—Mills & Onello, LLP

(57) ABSTRACT

A trench isolation type semiconductor device in which a recess is prevented from being formed in a field region and a method of fabricating the same are provided. The trench isolation type semiconductor device includes a semiconductor substrate defined by an active region and a field region, a trench formed in the field region, an oxide layer conformally formed along the inside of the trench, a liner layer conformally formed along the oxide layer, a field insulating layer formed inside the trench including the oxide layer and the liner layer, and a field protection layer formed on the field insulating layer so that a step difference does not occur on the semiconductor substrate.

12 Claims, 6 Drawing Sheets

TRENCH ISOLATION TYPE SEMICONDUCTOR DEVICE WHICH PREVENTS A RECESS FROM BEING FORMED IN A FIELD REGION AND METHOD OF FABRICATING THE SAME

This application is a divisional of U.S. application Ser. No. 11/301,510, filed on Dec. 13, 2005, which claims priority from Korean Patent Application No. 10-2004-0105646 filed on Dec. 14, 2004 in the Korean Intellectual Property Office, the contents of which are incorporated herein by reference in their entirety.

BACKGROUND OF THE INVENTION

1. Field of the Invention

The present invention relates to a semiconductor device and a method of fabricating the same, and more particularly, to a trench isolation type semiconductor device which prevents a recess from being formed in a field region, and a method of fabricating the same.

2. Description of the Related Art

As semiconductor devices become ever more highly integrated, technologies used to reduce the size of an isolation region, which takes up a considerable area of a semiconductor device, are being rapidly developed.

In general, semiconductor devices are isolated using LOCal Oxidation of Silicon (LOCOS). In LOCOS, a thin buffer insulating layer, that is, a pad oxide layer, is formed between a nitride layer and a semiconductor substrate and oxidized to form a field insulating layer to be used as an isolation region, so as to remove thermal stress. The thermal stress occurs because the thermal characteristics of the nitride layer, which is to be used as an oxide mask that defines an active region, are different than the thermal characteristics of the semiconductor substrate. Here, since the field insulating layer grows in a vertical direction with respect to the semiconductor substrate and oxidant ($O_2$) is dispersed in a horizontal direction along the buffer insulating layer, the field insulating layer experiences undergrowth at the edge of a nitride layer pattern.

The shape of a growth caused by the phenomenon in which the field insulating layer encroaches upon the active region is similar to a bird's beak and thus is referred to as a bird's beak. The length of the bird's beak corresponds to half the thickness of the field insulating layer. In this regard, in order to prevent a size reduction of the active region, the length of the bird's beak should be minimized.

In order to reduce the length of the bird's beak, a method of reducing the thickness of the field insulating layer has been introduced. However, in 16M or more DRAMs, if the thickness of the field insulating layer is reduced, an electrostatic capacity between an interconnection and a semiconductor substrate increases and a signal transmission speed is accordingly decreased. In addition, since a threshold voltage Vth of a parasitic transistor formed in an isolation region between devices is decreased by an interconnection to be used as a gate for a device, isolation characteristics between the devices are lowered.

Thus, methods of isolating devices by reducing the length of the bird's beak have been developed. The methods include poly Si buffered LOCOS (PBLOCOS) in which the thickness of a buffer insulating layer for buffering stress is reduced and a polycrystalline silicon layer is interposed between a semiconductor substrate and a nitride layer; sealed interface LOCOS (SILOCOS), which protects sidewalls of a buffer insulating layer with a nitride layer; and recess LOCOS, in which a field insulating layer is formed in a semiconductor substrate.

However, from the viewpoint of requirements of the surface planarity of isolation regions and the precision of a design rule, the aforementioned methods are not suitable for isolation technology for a next generation device such as a DRAM having an integration density of 256M or more.

Thus, buried oxide (BOX) type shallow trench isolation (STI) that can solve the problems of conventional isolation methods has been developed. In BOX type STI, a trench is formed in a semiconductor substrate and silicon oxide or polycrystalline silicon excluding dopant is filled into the trench using chemical vapor deposition (CVD). More specifically, the trench is filled with an oxide layer and the oxide layer is etched back so that a flat surface can be obtained. Thus, a bird's beak is not formed and an active region is not damaged.

Use of STI, in which the size of the field insulating layer can be reduced much more than by using LOCOS, provides a secured active region. However, the process steps are more complicated than in LOCOS, and the field insulating layer formed in the trench is damaged by subsequent processes such as cleaning of an oxide layer, wet etching and dry etching. That is, several tens to several hundreds of angstroms of the field insulating layer may be damaged by subsequent processes. Accordingly, a step difference is created between the active region and a field region having an isolation region formed thereon, and a transistor becomes defective.

SUMMARY OF THE INVENTION

The present invention provides a trench isolation type semiconductor device which prevents a recess from being formed in a space between gates of a field region by a subsequent process.

The present invention also provides a trench isolation type semiconductor device which facilitates a subsequent deposition process by preventing a recess from being formed in a space between gates of a field region.

The present invention also provides a trench isolation type semiconductor device which prevents junction leakage by preventing a recess from being formed in a field region by a subsequent process.

The present invention also provides a method of fabricating a trench isolation type semiconductor device.

According to an aspect of the present invention, there is provided a trench isolation type semiconductor device including a semiconductor substrate defined by an active region and a field region; a trench formed in the field region; an oxide layer conforming to and formed along the inside of the trench; a liner layer conforming to and formed along the oxide layer; a field insulating layer formed inside the trench including the oxide layer and the liner layer; and a field protection layer formed on the field insulating layer so that a step difference does not occur on the semiconductor substrate.

In one embodiment, the field protection layer includes a top protection layer and a corner protection layer. The field protection layer can be a silicon nitride layer. The field protection layer can have a thickness of 200 to 400 Å. The oxide layer can be a silicon oxide layer and the liner layer can be a silicon nitride layer. The field insulating layer can be a high density plasma (HDP) silicon oxide layer.

According to another aspect of the present invention, there is provided a method of fabricating a trench isolation type semiconductor device, the method including forming a trench in a field region of a semiconductor substrate using an etching mask including a buffer insulating layer pattern defining a trench region and a hard mask, conformally forming an oxide layer along the inside of the trench, conformally forming a liner layer along the oxide layer, forming a first field insulating layer in the trench including the oxide layer and the liner layer, forming a top protection layer on the first field insulating layer, forming a second field insulating layer on the top protection layer, at least partially removing the hard mask and the top protection layer formed on the hard mask, and forming a corner protection layer compensating for portions of each of the top protection layer formed on the first field insulating layer and the liner layer that are damaged in the removing of the hard mask and the top protection layer, to complete a field protection layer.

The field protection layer can be a silicon nitride layer. The buffer insulating layer pattern can be a silicon oxide layer and the hard mask can be a silicon nitride layer. The oxide layer can be a silicon oxide layer and the liner layer can be a silicon nitride layer. In the forming of the first field insulating layer, the first field insulating layer can be formed by forming a first insulating layer on the entire surface of the semiconductor substrate having the trench, planarizing the first insulating layer and etching the same until the first insulating layer has the same height as that of the semiconductor substrate. In the forming of the field protection layer, the thickness of the field protection layer can be substantially the same as that of the buffer insulating layer. The field protection layer can have a thickness of 200 to 400 Å. In the forming of the second field insulating layer, the second field insulating layer can be formed by forming a second insulating layer on the entire surface of the semiconductor substrate, planarizing the second insulating layer and etching the same until a top surface of the second insulating layer becomes lower than that of the hard mask. The second insulating layer can have a thickness of 200 to 400 Å. The first and second field insulating layers can be high density plasma (HDP) silicon oxide layers.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

The present invention will now be described more fully with reference to the accompanying drawings, in which preferred embodiments of this invention are shown.

Figure 1:
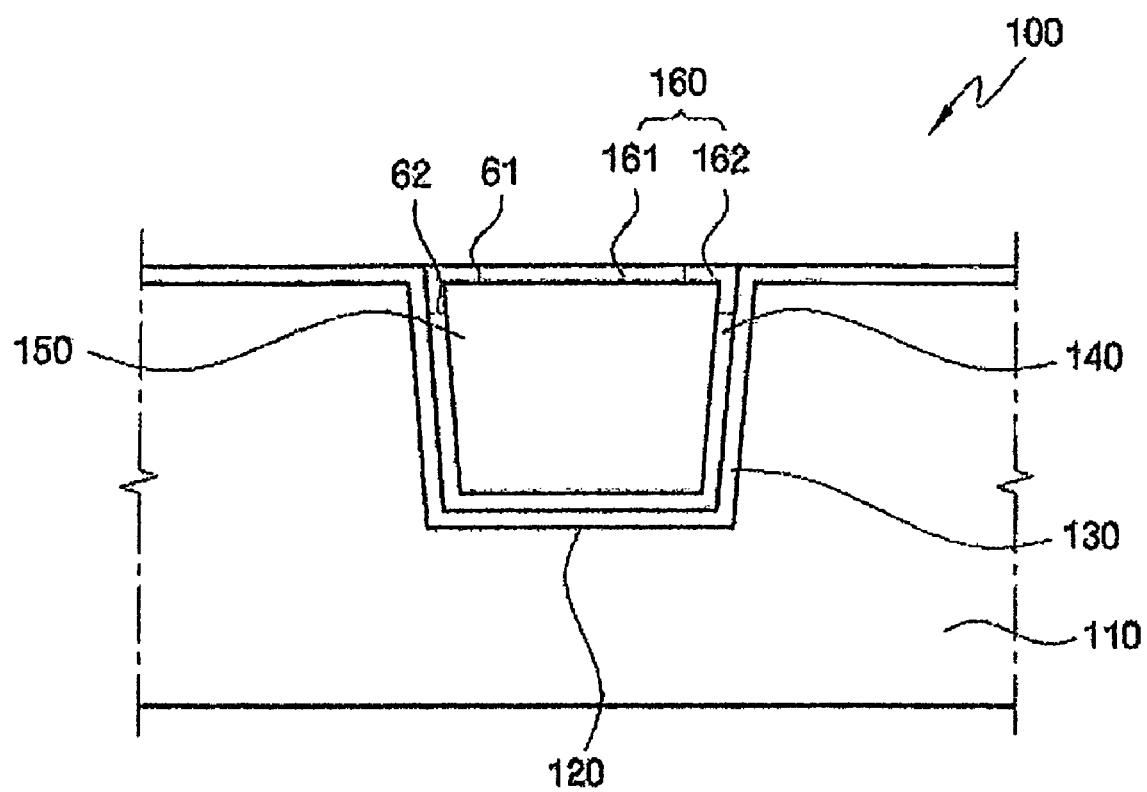
FIG. 1 is a cross-sectional view of an isolation region included in a trench isolation type semiconductor device according to an embodiment of the present invention.

FIG. 1 is a cross-sectional view of an isolation region included in a trench isolation type semiconductor device according to an embodiment of the present invention.

Referring to FIG. 1, a semiconductor device according to an embodiment of the present invention includes an isolation region 100 for isolating devices.

The isolation region 100 includes a trench 120 formed in a field region of a semiconductor substrate 110 defined by an active region and the field region.

An oxide layer 130 formed along the inside of the trench 120 may be included in the trench 120, so as to repair damage caused to the sidewalls and bottom when the trench 120 is formed. Further, the trench 120 may include a liner layer 140 having resistance to tensile stress on the oxide layer 130 formed inside the trench 120. Here, the oxide layer 130 may be a silicon oxide layer, and the liner layer 140 may be a silicon nitride layer. The thickness of the oxide layer 130 can be, for example, about 100 to 200 Å.

The trench 120 including the oxide layer 130 and the liner layer 140 is filled with a field insulating layer 150 having excellent gap-filling characteristics. High density plasma $SiO_2$ (HDP) may be used as the field insulating layer 150. The field insulating layer 150 can be formed to substantially the same height as that of the semiconductor substrate 110 in the trench 120.

In addition, a field protection layer 160 is formed on the trench 120 filled with the field insulating layer 150, so as to prevent a recess from being formed in the field region by a subsequent process. The field protection layer 160 may be, for example, a top protection layer 161 formed on a top surface of the field insulating layer 150 and a corner protection layer 162 filling a recess between the oxide layer 130 and the field insulating layer 150. The top protection layer 161 and the corner protection layer 162 may be formed of the same material as the liner layer 140. In this case, a boundary 61 between the top protection layer 161 and the corner protection layer 162 and a boundary 62 between the liner layer 140 and the corner protection layer 162 do not exist. The field protection layer 160 including the top protection layer 161 and the corner protection layer 162 may be a silicon nitride layer formed to a thickness that does not cause a step difference above the semiconductor substrate 110. In particular, the thickness of the field protection layer 160 is, for example, about 200 to 400 Å.

A method of fabricating a trench isolation type semiconductor device according to an embodiment of the present invention will now be described.

Figure 2:
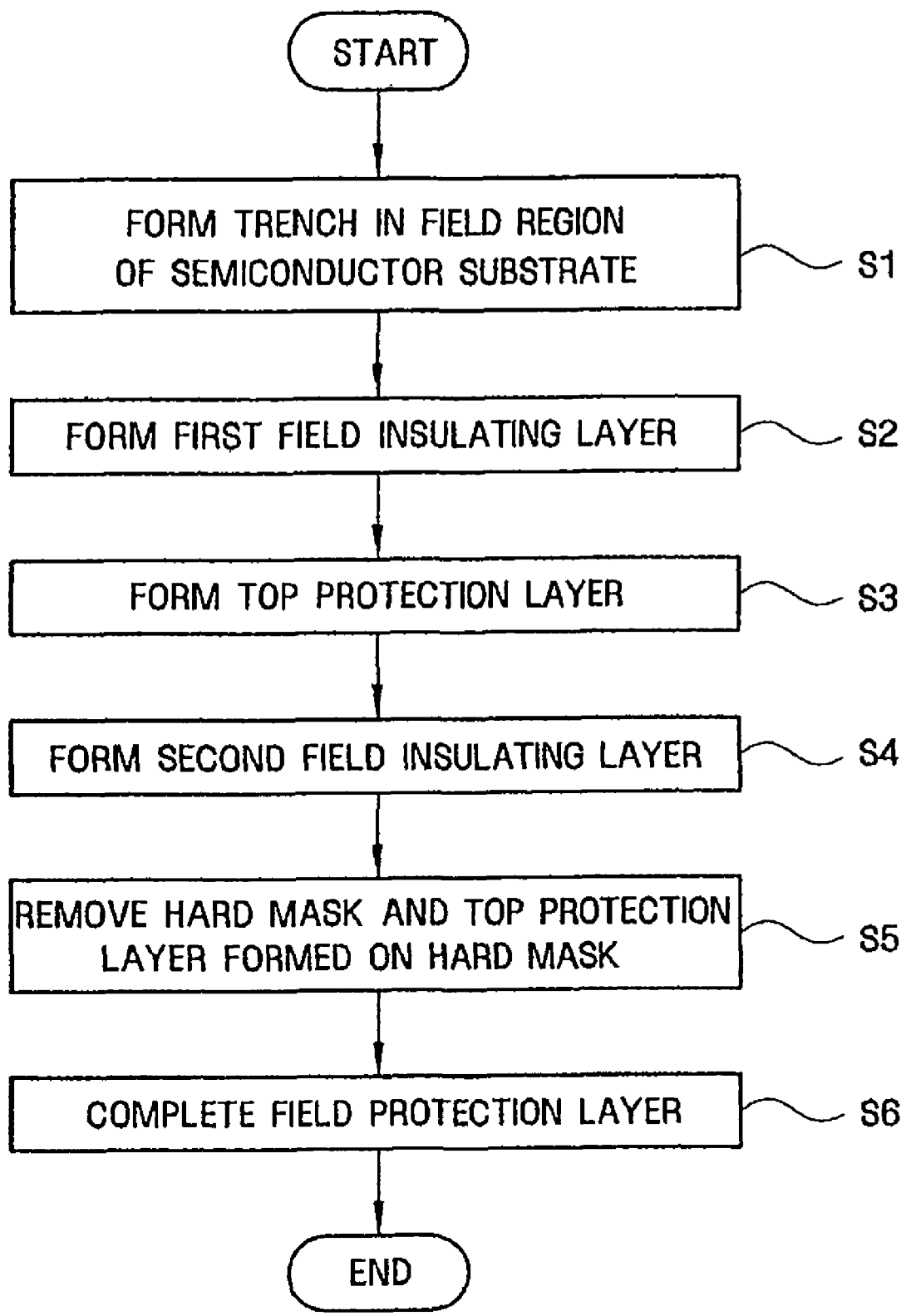
FIG. 2 is a flowchart illustrating a method of fabricating a trench isolation type semiconductor device according to an embodiment of the present invention.

FIG. 2 is a flowchart illustrating a method of fabricating a trench isolation type semiconductor device according to an embodiment of the present invention, and FIGS. 3A through 3H are cross-sectional views of structures formed in various processing steps in the method of fabricating the trench isolation type semiconductor device shown in FIG. 2.

Referring to FIG. 2, a trench is formed in a field region of a semiconductor substrate in step S1. Specifically, referring to FIG. 3A, an etching mask 185 including a buffer insulating layer pattern 170 and a hard mask 180 is formed on the entire surface of the semiconductor substrate 110. The buffer insulating layer pattern 170 is formed to prevent defects from occurring due to stress caused by a difference between the thermal expansion coefficients of the semiconductor substrate 110 and the hard mask 180. The buffer insulating layer pattern 170 may be formed of silicon oxide. In this case, the thickness of the buffer insulating layer pattern 170 is, for example, 100 to 300 Å. In addition, the hard mask 180 is used as an etching mask when the trench 120 is etched and may be formed of a material layer which can be selectivity etched with respect to the semiconductor substrate 110, such as silicon nitride. The hard mask 180 is also used as a planarization stop layer in a subsequent chemical mechanical polishing (CMP) process and is thick enough to prevent damage to an active region by a planarization process. For example, the hard mask 180 can be formed by depositing silicon nitride to a thickness of 1800 to 2200 Å. However, when an antireflection layer (not shown) that will be described later is formed, the thickness of the hard mask 180 can be smaller.

In order to form the etching mask 185, a buffer insulating layer and a hard mask layer are sequentially formed on the entire surface of the semiconductor substrate 110 using a conventional method such as chemical vapor deposition (CVD), sub-atmospheric CVD (SA CVD), low pressure CVD (LP CVD) or plasma enhanced CVD (PE CVD).

Subsequently, a photoresist (not shown) is formed on the hard mask layer. To stop reflection, an antireflection coating (ARC) layer may be further formed before the photoresist is formed on the hard mask layer.

Subsequently, in order to define a field region, exposure and development processes are performed to form a photoresist pattern. Next, the hard mask layer and the buffer insulating layer are patterned using dry etching using the photoresist pattern as an etching mask until the top surface of the semiconductor substrate 110 of the field region is exposed. To etch the buffer insulating layer, a gas such as $CF_4$, $CHF_3$, $C_2F_6$, $C_4F_8$, $CH_2F_2$, $CH_3F$, $CH_4$, $C_2H_2$ or $C_4F_6$, or a mixture of one or more of said gases is used. The patterning is performed so that the etching mask 185 used to expose the field region is formed. Subsequently, the photoresist pattern may be ashed using a conventional method, for example, oxygen plasma, and then removed using an organic stripping process.

The semiconductor substrate 110 exposed by the etching mask 185 is subsequently selectively etched so that the trench 120 is formed in the field region. When the trench 120 is filled with the field insulating layer 150, it may be desirable to form the trench 120 at an aspect ratio at which a void is not formed. The aspect ratio is determined depending on the gap-filling characteristics of the field insulating layer 150 with which the trench 120 will be filled. When the trench 120 is filled with the field insulating layer 150 having excellent gap-filling characteristics, the aspect ratio of the trench 120 may be large. However, in a case where the trench 120 is filled with a field insulating layer 150 having average filling characteristics, the aspect ratio of the trench 120 should be small.

Subsequently, a first field insulating layer is formed in the trench 120 in step S2.

Figure 3A:
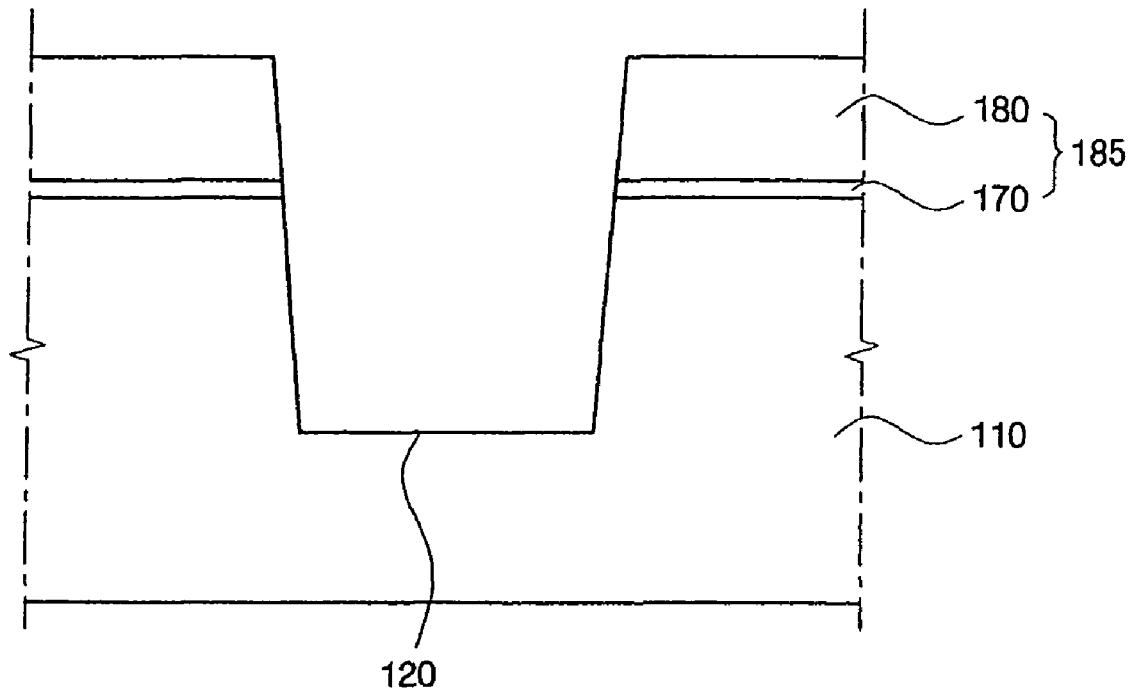
FIGS. 3A through 3H are cross-sectional views of structures formed in various processing steps of the method of fabricating the trench isolation type semiconductor device shown in FIG. 2.
Figure 3B:
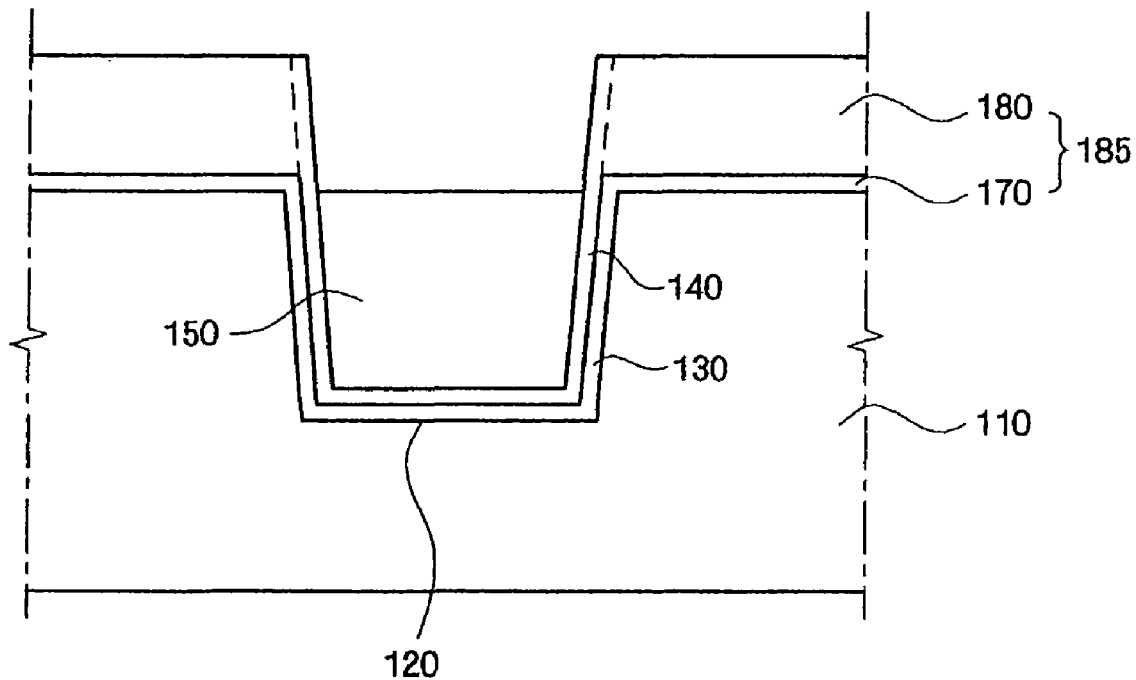

Referring to FIG. 3B, in order to repair damage to the sidewalls and bottom of the trench 120, the damage caused when the trench 120 is formed, an oxide layer 130 may be formed on the sidewalls and bottom of the trench 120, rather than directly within the trench 120. When forming the oxide layer 130, both furnace-type and chamber-type equipment can be used during thermal oxidation and $O_2$ or $H_2O$ can be supplied as an oxygen source and heated to 800 to 1100° C. Hydrochloric acid (HCl) may be added to this atmosphere to raise oxidation speed. However, HCl is not used in wet oxidation using $H_2O$ because a corrosion problem may be caused. In this case, the thickness of the oxide layer 130 may vary from 100 to 200 Å. In addition, the conformal liner layer 140 can be formed on the oxide layer 130. The liner layer 140 can be formed using a conventional method such as CVD, SA CVD, LP CVD or PE CVD.

The liner layer 140 may be an insulating layer such as silicon nitride, which has resistance to tensile stress, and the thickness of the liner layer 140 is in the range of 50 to 200 Å.

A first insulating layer is formed on the entire surface of the semiconductor substrate 110 in which the trench 120 including the oxide layer 130 and the liner layer 140 is formed, to a sufficient thickness to completely fill the trench 120. The first insulating layer can be formed of a silicon oxide such as high density plasma $SiO_2$ (HDP), which has excellent gap-filling characteristics. Subsequently, the first insulating layer is planarized using CMP, and isotropic etching, such as wet etching, is performed until the height of the first insulating layer inside the trench 120 is the same as that of the semiconductor substrate 110, to form the first field insulating layer 150. After forming the first field insulating layer 150, moisture therein is extracted and the first field insulating layer 150 is hardened at 800 to 1100° C. under an atmosphere of $N_2$, $O_2$, or $H_2O$ for densification, so that damage caused by a subsequent etching process may be minimized. The hardening is optional and may be omitted.

Subsequently, a top protection layer is formed in step S3.

Figure 3C:
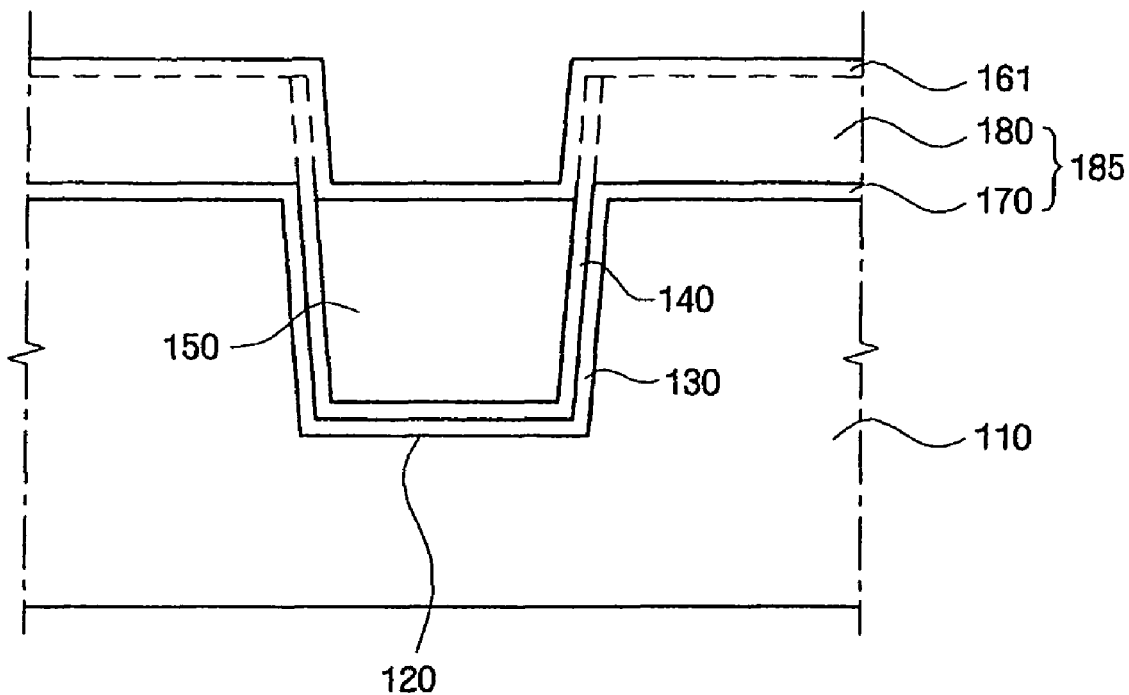

Referring to FIG. 3C, a top protection layer 161 of the first field insulating layer 150 is conformally formed on the entire surface of the semiconductor substrate 110 on which the first field insulating layer 150 is formed inside the trench 120. The top protection layer 161 may be formed using a conventional method such as CVD, SA CVD, LP CVD or PE CVD. The top protection layer 161 is used to prevent a recess from being formed in a field region of the semiconductor substrate 110 by a subsequent process. In particular, silicon nitride may be used for the top protection layer 161. In this case, the thickness of the top protection layer 161 may be in the range of 200 to 400 Å. Subsequently, a second field insulating layer is formed in step S4.

Figure 3D:
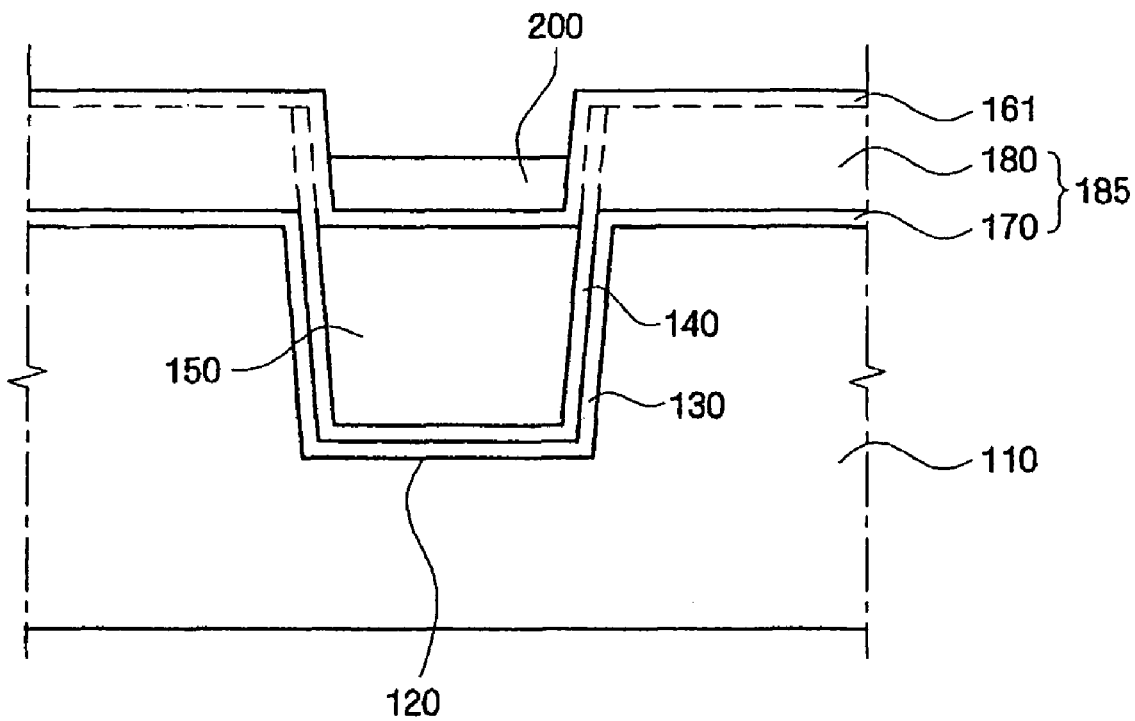

Referring to FIG. 3D, a second insulating layer is formed to a large thickness on the entire surface of the semiconductor substrate 110 including the top protection layer 161. The second insulating layer has a high etching selectivity with respect to the hard mask 180 and may be an insulating layer having excellent gap-filling characteristics. For example, the second insulating layer may be formed of HDP. The second insulating layer is planarized using CMP, and isotropic etching, such as wet etching, is performed so that a second field insulating layer 200 whose top surface is lower than that of the hard mask 180 is formed. The second field insulating layer 200 is used to prevent the top protection layer 161 formed of, for example, silicon nitride, from being damaged when the hard mask 180 is removed in a subsequent process. Here, the thickness of the second field insulating layer 200 may be in the range of 200 to 400 Å.

Subsequently, the hard mask 180 and the top protection layer 161 formed on the hard mask 180 are removed in step S5.

Figure 3E:
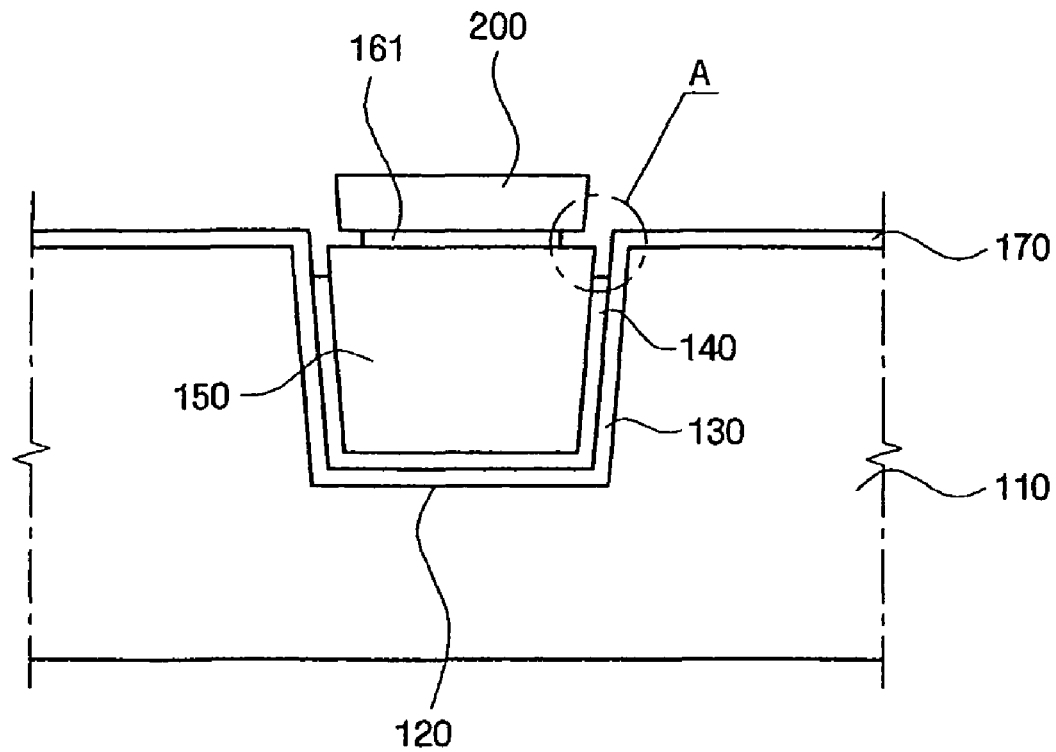

Referring to FIG. 3E, the hard mask 180 and the top protection layer 161 formed on the hard mask 180 are etched and removed so that the surface of the buffer insulating layer pattern 170 on the semiconductor substrate 110 is exposed. In this case, wet etching using $H_3PO_4$ stripper or dry etching using plasma may be used. A part of the top protection layer 161 formed on the top surface of the first field insulating layer 150 and a part of the liner layer 140 may be damaged at a corner of the first field insulating layer 150 (region A).

Subsequently, the damaged top protection layer 161 and liner layer 140 are compensated so that a field protection layer is completed in step S6.

Figure 3F:
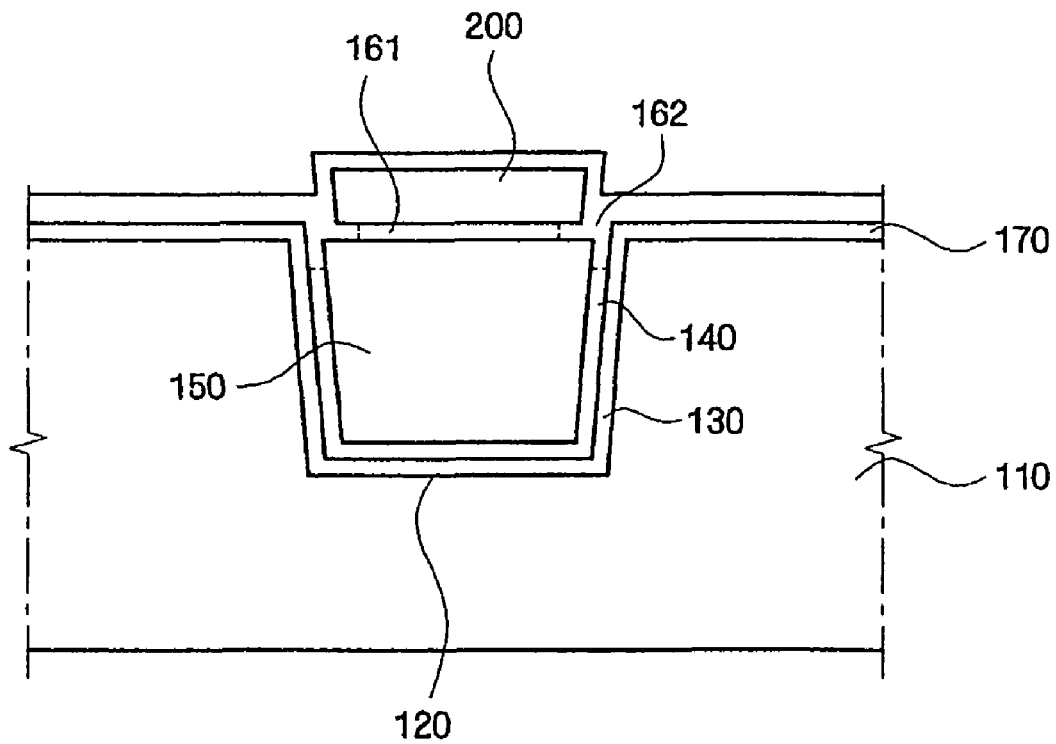

Referring to FIG. 3F, a corner protection layer 162 is formed on the semiconductor substrate 110 to a thickness of about 200 to 400 Å, so as to repair damage to the top protection layer 161 and the liner layer 140 occurring at the corner of the first field insulating layer 150 when the hard mask 180 and the top protection layer 161 formed on the hard mask 180 are removed. In this case, the corner protection layer 162 may be formed of silicon nitride using a conventional method such as CVD, SA CVD, LP CVD or PE CVD. By forming the corner protection layer 162 of silicon nitride, the damaged portion A in the corner of the first field insulating layer 150 can be completely filled with the silicon nitride.

Figure 3G:
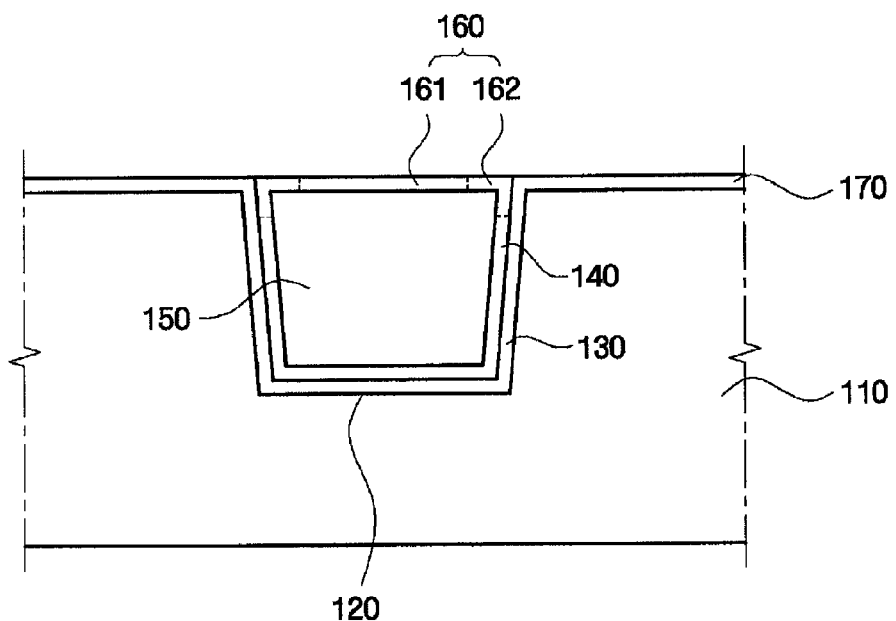

Referring to FIG. 3G, the excess material used to form the corner protection layer 162, which compensates for the damaged portion A in the corner of the first field insulating layer 150, and the second field insulating layer 200 is removed using wet etching and dry etching. In this way, a field protection layer 160 that prevents a recess from being formed in a field region can be completed in a subsequent process.

Figure 3H:
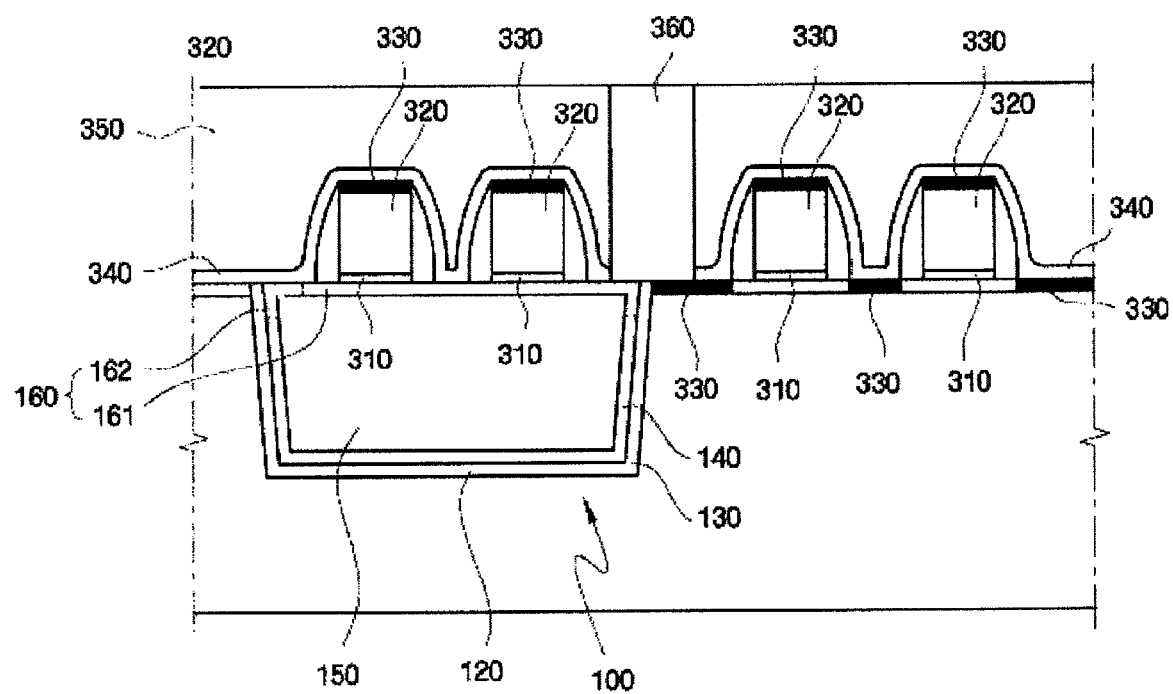

Referring to FIG. 3H, after an isolation region 100 of the trench isolation type semiconductor device is formed, a gate insulating layer 310, a gate electrode 320, a source/drain region (not shown), and a salicide layer 330 are formed using a conventional process.

Subsequently, interlevel dielectric layers (ILDs) 340 and 350 are sequentially deposited and selectively removed so that a predetermined part of the surface of the salicide layer 330 in which the source/drain region is formed is exposed using a photolithographic process, and a contact 360 is formed, thereby fabricating a semiconductor device.

In the above-described trench isolation type semiconductor device including the isolation region formed using the method of fabricating the same according to an embodiment of the present invention, formation of a field recess in a subsequent process after the isolation region is formed can be prevented.

Thus, a recess is prevented from being formed in a space between gates formed on the field region. As is well known, as a semiconductor device becomes highly integrated, the space between gates is reduced. Thus, when a recess is formed in the space between gates formed on the field region by the subsequent process, a subsequent deposition process may not easily be performed. In the trench isolation type semiconductor device including the isolation region formed using the method of fabricating the same according to the present invention, however, a field recess is not formed by the subsequent process. Therefore, a deposition process can be easily performed.

In addition, in the trench isolation type semiconductor device including the isolation region formed using the method of fabricating the same according to the present invention, even though misalignment occurs when the contract is formed at a boundary surface of the active region and the field region, a field recess is prevented from being formed by a field protection layer formed in the isolation region. Therefore, junction leakage does not occur. This serves as an important factor for reliability of the semiconductor device.

As described above, in the trench isolation type semiconductor device and the method of fabricating the same according to the present invention, a field protection layer that can protect a field insulating layer is formed on an isolation region, thereby preventing a field recess by a subsequent process of fabricating the semiconductor device. Thus, a recess is prevented from being formed in a space between gates formed on the field region by the subsequent process, thereby enabling a deposition process to be easily performed. In addition, even though misalignment occurs when a contact is formed at a boundary surface between an active region and a field region, a recess is prevented from being formed in the field region by a field protection layer, thereby alleviating a possibility of junction leakage. This results in increasing a process efficiency of the semiconductor device.

While the present invention has been particularly shown and described with reference to exemplary embodiments thereof, it will be understood by those skilled in the art that various changes in form and details may be made therein without departing from the spirit and scope of the invention as defined by the following claims and equivalents thereof.

What is claimed is:

1. A method of fabricating a trench isolation type semiconductor device, the method comprising:
   forming a trench in a field region of a semiconductor substrate using an etching mask, the etching mask including a buffer insulating layer pattern defining a trench region and a hard mask;
   conformally forming an oxide layer along the inside of the trench;
   conformally forming a liner layer along the oxide layer;
   forming a first field insulating layer in the trench including the oxide layer and the liner layer;
   forming a top protection layer on the first field insulating layer;
   forming a second field insulating layer on the top protection layer;
   at least partially removing the hard mask and the top protection layer formed on the hard mask;
   forming a corner protection layer compensating for portions of each of the top protection layer formed on the first field insulating layer and beneath the second field insulating layer and the liner layer that are damaged in the removing of the hard mask and the top protection layer; and
   removing excess portions of the corner protection layer and the second field insulating layer to complete a field protection layer.

2. The method of claim 1, wherein the field protection layer is a silicon nitride layer.

3. The method of claim 1, wherein the buffer insulating layer pattern is a silicon oxide layer and the hard mask is a silicon nitride layer.

4. The method of claim 1, wherein the oxide layer is a silicon oxide layer and the liner layer is a silicon nitride layer.

5. The method of claim 1, wherein in the forming of the first field insulating layer, the first field insulating layer is formed by forming a first insulating layer on the entire surface of the semiconductor substrate having the trench, planarizing the first insulating layer and etching the same until the first insulating layer has the same height as that of the semiconductor substrate.

6. The method of claim 1, wherein in the forming of the field protection layer, the thickness of the field protection layer is substantially the same as that of the buffer insulating layer.

7. The method of claim 6, wherein the field protection layer has a thickness of 200 to 400 Å.

8. The method of claim 1, wherein in the forming of the second field insulating layer, the second field insulating layer is formed by forming a second insulating layer on the entire surface of the semiconductor substrate, planarizing the second insulating layer and etching the same until a top surface of the second insulating layer becomes lower than that of the hard mask.

9. The method of claim 8, wherein the second insulating layer has a thickness of 200 to 400 Å.

10. The method of claim 8, wherein the first and second field insulating layers are high density plasma (HDP) silicon oxide layers.

11. The method of claim 1, wherein the field protection layer covers all exposed surfaces of the first field insulating layer.

12. The method of claim 1, wherein the first field insulating layer is formed to substantially a same height as a height of the semiconductor substrate.

* * * * *